United States Patent [19]
Durante

[11] Patent Number: 5,765,184
[45] Date of Patent: Jun. 9, 1998

[54] METHOD AND APPARATUS FOR PROGRAMMING AN ARRAY CONTROLLER IN A FLASH MEMORY DEVICE

[75] Inventor: Richard Joseph Durante, Citrus Heights, Calif.

[73] Assignee: Intel Corporation, Santa Clara, Calif.

[21] Appl. No.: 720,311

[22] Filed: Sep. 27, 1996

Related U.S. Application Data

[63] Continuation of Ser. No. 142,690, Oct. 26, 1993, abandoned.

[51] Int. Cl.$^6$ .................... G11C 8/00; G06F 12/00
[52] U.S. Cl. .................. 711/103; 711/101; 365/185.79; 365/185.33; 365/189.05; 365/230.06
[58] Field of Search .................. 365/185.29, 185.33, 365/189.05, 230.06; 395/428, 429, 430; 711/101, 102, 103

[56] References Cited

U.S. PATENT DOCUMENTS

| | | | |
|---|---|---|---|
| 4,642,759 | 2/1987 | Foster | 395/500 |
| 4,644,494 | 2/1987 | Muller | 711/152 |
| 4,763,305 | 8/1988 | Kuo | 365/185.22 |
| 4,802,117 | 1/1989 | Chrosny et al. | 395/182.03 |
| 4,896,262 | 1/1990 | Wayama et al. | 395/500 |
| 4,958,315 | 9/1990 | Balch | 395/500 |
| 5,012,425 | 4/1991 | Brown | 705/405 |
| 5,047,989 | 9/1991 | Canepa et al. | 365/238.5 |
| 5,070,474 | 12/1991 | Tuma et al. | 395/500 |
| 5,077,737 | 12/1991 | Leger et al. | 395/182.04 |
| 5,101,490 | 3/1992 | Getson, Jr. et al. | 395/835 |
| 5,111,385 | 5/1992 | Hattori | 711/157 |
| 5,131,089 | 7/1992 | Cole | 395/500 |

(List continued on next page.)

FOREIGN PATENT DOCUMENTS

| | | |
|---|---|---|
| 2088442 | 7/1993 | Canada. |
| 0 175 458 A2 | 3/1986 | European Pat. Off.. |

(List continued on next page.)

OTHER PUBLICATIONS

Chen, Walter, "Flash: Big News in Storage Are Diskless Computers the Wave of the Future", *Storage Magazine*, Nov./Dec. 1992, pp. 10-4-10-7.

Gross, Stephen J. and Jorge-Luis Sanchez, "Solid-State Mass Storage Arrives", *Product Feature, Memory Card Systems & Design*, Jul./Aug. 1992.

Robinson, Kurt, "Trends in Flash Memory System Design", *Wescon Conference Record*, Nov. 1990, pp. 468–472.

Preliminary Search Report for French Patent Application No. 94 12595 dated Dec. 5, 1996.

Preliminary Search Report for French Patent Application No. 95 01929 dated Dec. 4, 1996.

–British Search report for corresponding U.K. Application No. 9420169.6, 1 page (Jan. 10, 1995).

–U.K. Search Report for Application No. GB 9420169.6, 1 page (May 24, 1995).

*Primary Examiner*—Tod R. Swann
*Assistant Examiner*—Tuan V. Thai
*Attorney, Agent, or Firm*—Blakely, Sokoloff, Taylor & Zafman

[57] ABSTRACT

A flash memory device including programmable code store circuitry. The code store circuitry stores algorithms used by an array controller to erase and program a nonvolatile main memory array. The code store circuitry includes a nonvolatile instruction memory, which stores instructions. The code store circuitry also includes a number of support circuits, such as address decode circuitry, sense path circuitry, main array interface circuitry and several voltage generators. These circuits operate in several modes. In read mode, these support circuits ensure that the instruction data stored in the instruction memory is output to the array controller. In program and erase modes, the support circuits allow control of voltage level applied to the instruction memory and output of instruction to data to the user. In other words, these modes permit modification of the instruction memory. The support circuits are placed in the various modes via control signals output from control registers. Because these control registers are accessible to the device user, the user controls the mode in which the code store circuitry operates.

12 Claims, 14 Drawing Sheets

U.S. PATENT DOCUMENTS

| | | | |
|---|---|---|---|
| 5,138,580 | 8/1992 | Farrugia et al. | 365/218 |
| 5,199,033 | 3/1993 | McGeoch et al. | 395/182.05 |
| 5,200,959 | 4/1993 | Gross et al. | 371/21.6 |
| 5,214,776 | 5/1993 | Bagnoli et al. | 395/430 |
| 5,224,070 | 6/1993 | Fandrich et al. | 365/185.33 |
| 5,239,509 | 8/1993 | Ikawa et al. | 365/201 |
| 5,268,870 | 12/1993 | Harari | 365/218 |
| 5,297,103 | 3/1994 | Higuchi . | |
| 5,299,163 | 3/1994 | Mortigami | 365/201 |
| 5,305,276 | 4/1994 | Uenoyama | 365/230.01 |
| 5,327,383 | 7/1994 | Merchant | 365/218 |
| 5,333,300 | 7/1994 | Fandrich | 395/430 |
| 5,353,256 | 10/1994 | Fandrich et al. | 365/230.03 |
| 5,357,627 | 10/1994 | Miyazawa et al. | 395/182.04 |
| 5,365,481 | 11/1994 | Sawada | 365/201 |
| 5,369,754 | 11/1994 | Fandrich et al. | 395/430 |
| 5,406,529 | 4/1995 | Asano | 365/230.03 |
| 5,418,752 | 5/1995 | Harari et al. | 365/218 |
| 5,509,134 | 4/1996 | Fandrich et al. | 395/430 |
| 5,524,230 | 6/1996 | Sakaue et al. | 711/103 |
| 5,602,987 | 2/1997 | Harari et al. | 395/182.08 |

FOREIGN PATENT DOCUMENTS

| | | |
|---|---|---|
| 0239283 | 9/1987 | European Pat. Off. . |
| 0 392 895 A2 | 10/1990 | European Pat. Off. . |
| 0464433 | 1/1992 | European Pat. Off. . |
| 0489204 | 6/1992 | European Pat. Off. . |
| A-2605785 | 4/1988 | France . |
| A-03186927 | 8/1991 | Japan . |
| 2 251 323 | 7/1992 | United Kingdom . |
| 2 251 324 | 7/1992 | United Kingdom . |

TABLE I

| MODE | PCADD (10:0) | ALTADD (10:0) | AEN | FLTBL | WSELECTC (2:0) | GWL | USEPB | ACVPXSW | ACVPSSW | ACVPYSW | ACVPWSW | IW (18:0) | MASEN (15:0) | SOURCE | WORDLINES SELECTED | WORDLINES DESELECTED | COLUMNS SELECTED | COLUMNS DESELECTED |
|---|---|---|---|---|---|---|---|---|---|---|---|---|---|---|---|---|---|---|
| READ | VVV | XXX | 0 | 0 | 0 | 0 | 0 | 0 | 0 | 0 | 0 | VVVVV | NNNN | Vss | Vcc | Vss | Vbl [c] | Vss |
| PROGRAM | XXX | VVV | 1 | 0 | V | 0 | 19 | 1 | 0 | 1 | 1 | XXXXX | NNNN | Vss | Vpp | Vss | Vp1 [e] | Vss |
| ERASE | XXX | VVV | 1 | 1 | 0 | 1 | 19 | 0 | 1 | 0 | 0 | XXXXX | NNNN | Vpp | Vss | Vss | FLT | FLT |
| MAIN ACCESS [f] | XXX | VVV | 1 | 0 | V | 0 | 19 | ? | ? | ? | ? | NNNNN | VVVV | Vss | ? | Vss | ? | Vss |

A. ALL MULTI-BIT SIGNALS ARE DESIGNATED IN HEXADECIMAL.
B. "X" = IGNORED INPUT FOR THIS MODE, "V" = VALID INPUT REQUIRED IN THIS MODE.
C. "N" OUTPUT = NOT DRIVEN BY CODE STORE CIRCUITRY, "V" = VALID OUTPUT IN THIS MODE, "X" = UNKNOWN VALUE.
D. BITLINE VOLTAGE, VBL, DETERMINED BY SENSE PATH CIRCUITRY.
E. PROGRAM LOAD LINE VOLTAGE, VP1, DETERMINED BY READ/WRITE PATH PROGRAM LOADS.
F. MAIN ACCESS MODE ALLOWS ACCESS TO CODE STORE CIRCUITRY THROUGH READ/WRITE PATH FOR READ PROGRAM VERIFY, ERASE VERIFY AND OTHER OPERATIONS.
G. USEPB IS SET IF THE ARRAY CONTROLLER IS RUNNING FROM THE PAGE BUFFER DURING THESE MODES.

FIGURE 4

| MODE OF CIRCUITRY 40 | INPUTS | | | | | OUTPUTS |
|---|---|---|---|---|---|---|
| | USEPB | FLTBL | AEN | ADD (10:9) | | CG (3:0) |
| READ | 0 | 0 | X | 00 | | 1110 |
| | 0 | 0 | X | 01 | | 1101 |
| | 0 | 0 | X | 10 | | 1011 |
| | 0 | 0 | X | 11 | | 0111 |
| MAIN ARRAY/ PROGRAM | X | 0 | 1 | 00 | | 0111 |
| | X | 0 | 1 | 01 | | 1110 |
| | X | 0 | 1 | 10 | | 1101 |
| | X | 0 | 1 | 11 | | 1011 |
| ERASE | X | 1 | X | XX | | 0000 |

TABLE II

FIGURE 6

| INPUTS | | | OUTPUTS | | | |
|---|---|---|---|---|---|---|
| AE | WSELECTC (2:0) | USEPB | PCHG | PGHGB | READ | REFENB |
| X | 000 | 0 | 00 | 0 | 1 | 0 |
| X | 000 | 0 | 1 | 1 | 1 | 0 |
| X | 000 | 1 | X | 0 | 0 | 1 |
| X | NOT 000 | X | X | 0 | 0 | 1 |
| 1 | 000 | X | X | 0 | 0 | 1 |

TABLE III

FIGURE 7b

| MODE | PBCONFIG (2:0) | DESCRIPTION |
|---|---|---|
| 0 | 000 | DISABLE |
| 1 | 001 | RUN ARRAY CONTROLLER FROM PAGE BUFFER |
| 2 | 010 | USER INTERFACE READS FROM A PLANE-USER MODE |
| 3 | 011 | USER INTERFACE WRITES TO A PLANE-USER MODE |
| 4 | 100 | ARRAY CONTROLLER READS FROM A PLANE |
| 5 | 101 | ARRAY CONTROLLER WRITES TO A PLANE |
| 6 | 110 | USER INTERFACE READS IN TEST MODE-EXTENDED SPACE |
| 7 | 111 | USER INTERFACE WRITES IN TEST MODE-EXTENDED SPACE |

TABLE IV

FIGURE 10

METHOD AND APPARATUS FOR PROGRAMMING AN ARRAY CONTROLLER IN A FLASH MEMORY DEVICE

This is a divisional of application Ser. No. 08/142,690, filed 10/26/93 now abandoned.

FIELD OF THE INVENTION

The present invention relates to nonvolatile semiconductor memories. More particularly, the present invention relates to a programmable code store circuit, which stores the instructions for programming and erasing a main memory array of a nonvolatile memory device.

BACKGROUND OF THE INVENTION

One prior nonvolatile semiconductor memory is the flash electrically erasable programmable read-only memory ("flash"). Flash memories are programmed electrically and, once programmed, retain data until erased. After erasure, flash memories may be programmed with new code or data.

Flash memories differ from conventional electrically erasable programmable read-only memories ("EEPROM") with respect to erasure. Conventional EEPROMS typically use a select transistor for individual byte erasure control. Flash memories, on the other hand, typically achieve much higher densities using single transistor cells. Some prior flash memories are erased by applying a high voltage to the source of every memory cell in the memory array simultaneously. This results in the full array erasure.

Flash memory conventions define a logical one as few, if any, electrons are stored on the floating gate of a memory cell. Convention also defines a logical zero as many electrons stored on the floating gate of the memory cell. Erasure of the flash memory causes a logical one to be stored in each bit cell. Flash memory cells cannot be overwritten individually from a logical zero to a logical one without prior erasure. However, a flash memory cell can be overwritten individually from a logical one to a logical zero, because this entails simply adding electrons to a floating gate that contains the intrinsic number of electrons associated with the erased state.

The process for erasure, programming and verification of flash memories requires careful control of the voltages required to perform those steps. For example, one prior art flash memory is the 28F068SA complimentary metal oxide semiconductor ("CMOS") flash memory sold by Intel Corporation of Santa Clara, California, which is a 8 megabit flash memory. The 28F008SA flash memory includes a command register to manage erasure and programming. The command register contents serve as input to an internal state machine that controls erasure and programming circuitry. The internal state machine is realized using a programmable logic array (PLA), which stores the algorithms for erasing and programming the flash memory array. After fabrication of the PLA, the algorithms stored by it cannot be modified. Thus, adding functionality to the memory device subsequent to its manufacture is not possible.

SUMMARY OF THE INVENTION

An object of the present invention is to permit modification of a nonvolatile memory device after manufacture.

Another object of the present invention is to permit modification of algorithms controlling programming and erasure of a nonvolatile memory device subsequent to the manufacture of the device.

A flash memory device including programmable code store circuitry is described. The code store circuitry stores algorithms used by an array controller to erase and program a nonvolatile main memory array. The code store circuitry includes a nonvolatile instruction memory, which stores instructions. The code store circuitry also includes a number of support circuits, such as address decode circuitry, sense path circuitry, main array interface circuitry and several voltage generators. These circuits operate in several modes. In read mode, these support circuits ensure that the instruction data stored in the instruction memory is output to the array controller. In program and erase modes, the support circuits allow control of voltage levels applied to the instruction memory and output of instruction to data to the user. In other words, these modes permit modification of the instruction memory. The support circuits are placed in the various modes via control signals output from control registers. Because these control registers are accessible to the device user, the user controls the mode in which the code store circuitry operates.

A method of modifying the data stored in the instruction memory of the code store circuitry is also described. First, the user writes an algorithm for programming the instruction memory into the page buffer. The user then places the code store circuitry in a program mode by setting various control bits within control registers. These control signals allow the user to control the address input to the instruction memory and to set voltage levels applied to the instruction memory. These control signals also couple the output of the instruction memory array to high voltage circuitry within the read/write path to permit programming and verification. Afterward, the user configures the page buffer to function as the source of instructions for the array controller. Execution of the instructions in the page buffer then modifies the instruction memory.

Other objects, features, and advantages of the present invention will be apparent from the accompanying drawings and the detailed description that follows.

BRIEF DESCRIPTION OF THE FIGURES

The present invention is illustrated by way of example and not limitation in the figures of the accompanying drawings in which references indicate similar elements and in which:

FIG. 4 illustrates Table I, which defines the modes of the code store circuitry.

FIG. 6 illustrates Table II, which defines the operation of the column grounding decode logic.

FIG. 7B illustrates Table III, which defines the operation of the sense amp controller of the sense path circuitry.

FIG. 10 illustrates Table IV, which defines the modes of the page buffer.

DETAILED DESCRIPTION

Figure 1:
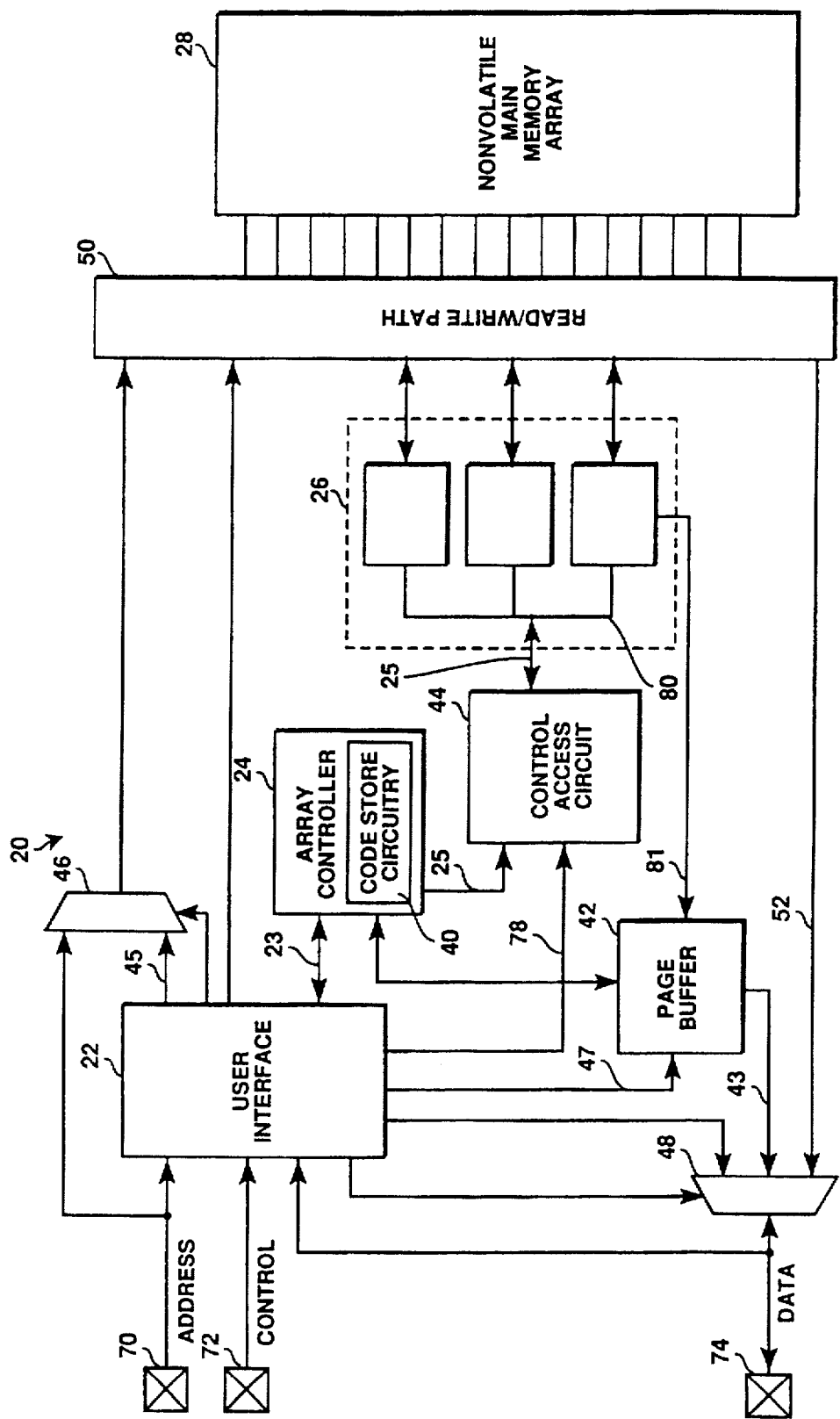
FIG. 1 is a block diagram of a nonvolatile memory device.

FIG. 1 illustrates in block diagram form nonvolatile memory device 20, which incorporates the method and circuitry of the present invention. Memory device 20 includes user interface 22, array controller 24 controls, control register circuits 26 and nonvolatile main memory array 28. Array controller 24 controls the programming and erasure of main memory array 28 using code store circuitry 40.

As will be described in detail herein, code store circuitry 40 includes a nonvolatile instruction memory that stores program and erase algorithms for device 20. Code store circuitry 40 permits modification of the instruction memory, thereby modifying the operation of memory device 20 subsequent to manufacture. In special modes of code store circuitry 40 the instruction memory can be modified if page buffer 42 is used as a source of instructions for array controller 24 provided page buffer 42 stores an algorithm to modify the instruction memory array. In these special modes, code store circuitry 40 enables main array interface circuitry to allow programming of the instruction store memory using the program load lines of read/write path 50.

Prior to beginning that detailed discussion, consider again FIG. 1. Memory device 20 also includes control access circuit 44, address multiplexer 46, output multiplexer 48 and read/write path 50. These circuits 44, 46, 48 and 50 in cooperation with user interface 22 and array controller 24, make using main memory array 28 relatively simple for the user.

Main memory array 28 provides random access, nonvolatile, large scale data storage for the external user. Main memory array 28 preferably includes 32 blocks of flash memory cells. Each block of memory provides 64k bytes of data storage.

Main memory array 28 stores 16 bit wide words, using one flash memory cell to store each bit. Consequently, read/write path 50 includes only 16 sensing circuits and high voltage program loads.

User interface 22 functions as an arbiter between the user issuing commands and array controller 24, which executes selected commands. For example, user interface 22 determines if the user's requested operation is valid given the current state of array controller 24. User interface 22 receives as input the command and address information from pins 70, 72, and 74 and determines the operation, or command, array controller 24 should execute. If the requested operation is a program or block erase command, the command and data signals 72 and 74 are transferred to array controller 24 via queue bus 23. Address information associated with a command is forwarded by user interface 22 to read/write path 50 via multiplexer 46.

User interface 22 selects an input address for read/write path 50 via control of input address multiplexer 46. The selected input address is either the address sensed by TTL buffers (not shown) on user address bus 70, or a latched address 45 from user interface 22.

User interface 22 controls output multiplexer 48 to select a source for output data to the user. That data is transferred over user data bus 74. The selected output data may be either data 52 from read/write path 50 or data 43 from page buffer 42.

Array controller 24 controls the different components needed to program, erase and verify main memory array 28.

Array controller 24 executes the algorithms that sequence the high voltage circuitry of read/write path 50 to apply and remove charge from flash memory cells within main memory array 28.

Control access circuit 44 enables both user interface 22 and array controller 24 to access control registers 26 via central control bus 80. During normal operation, array controller 24 controls control access circuit 44 and thus controls access to control registers 26. Control access circuit 44 passes information to and from array controller 24.

Array controller 24 writes to specialized control registers 26 by transferring a write control signal, and a register address along with corresponding write data to control access circuit 44 via bus 25. Control access circuit 44 then generates a write cycle and couples it to central control bus 80 to write to the addressed control register. Array controller 24 reads control registers 26 by transferring a register address and read control signal to control access circuit 44 over the bus 25. Control access circuit 44 then generates a read access cycle and couples it to central control bus 80 to read the addressed control register.

The memory device user can access control registers 26 by issuing a trap door command. The trap door command switches control access circuit 44, and thus control of control registers circuitry 26, to user interface 22. Once the trap door is open, the memory device user can address and write to control registers 26. By doing so, the memory user device user is able to configure code store circuitry 40 so that the instruction memory can be modified. This is because many of the control signals for code store circuitry 40 are generated by registers 26. Control bits within control registers 26 include ALTADD(10:0), AEN, GWL, USEPB, ACVPXSW, ACVPSSW, ACVPYSW, ACVPWSW, FLTBL, PBCONFIG(2:0) and WSELECTC(2:0). The effect of each of these bits upon code store circuitry 40 will be described in detail below.

Control registers 26 are preferably realized as a number of D-type flip-flops, access to each of which is controlled by an individual address decoder. Addresses are sent to control registers 26 over control bus 80.

User interface 22 and array controller 24 share page buffer 42, which allows memory device 20 to operate in a variety of ways. For example, page buffer 42 can be used to buffer data that is to be programmed into main memory array 28 such that data is streamed into main memory array 28 to increase its throughput. As will be described below, page buffer 42 may also be used to program the instruction memory within circuitry 40.

In a preferred embodiment page buffer 42 is a 128×19×2 memory array of SRAM cells. Page buffer 42 is preferably split into two planes of SRAM memory. This two plane architecture allows array controller 24 to have read/write access to one plane and user interface 22 the other plane at the same time. Depending on its mode, page buffer 42 functions as an 8-bit, 16-bit or 19-bit memory. When operating as a 19-bit memory, page buffer 42 can be used to program code store circuitry 40. The page buffer mode also controls whether page buffer 42 is one contiguous memory plane or two memory planes.

Page buffer 42 can be used for various purposes. Array controller 24 can use page buffer 42 to store jump offsets, data and address information for pipeline programming. Through user interface 22, the external user can also use a page buffer plane as a fast read/write memory by itself. Array controller 24 can be instructed to execute instructions stored in page buffer 42. In other words, page buffer 42 can act as the microcode storage for array controller 24. In this mode, page buffer 42 is preferably configured as one contiguous memory.

A. The Array Controller

Figure 2:
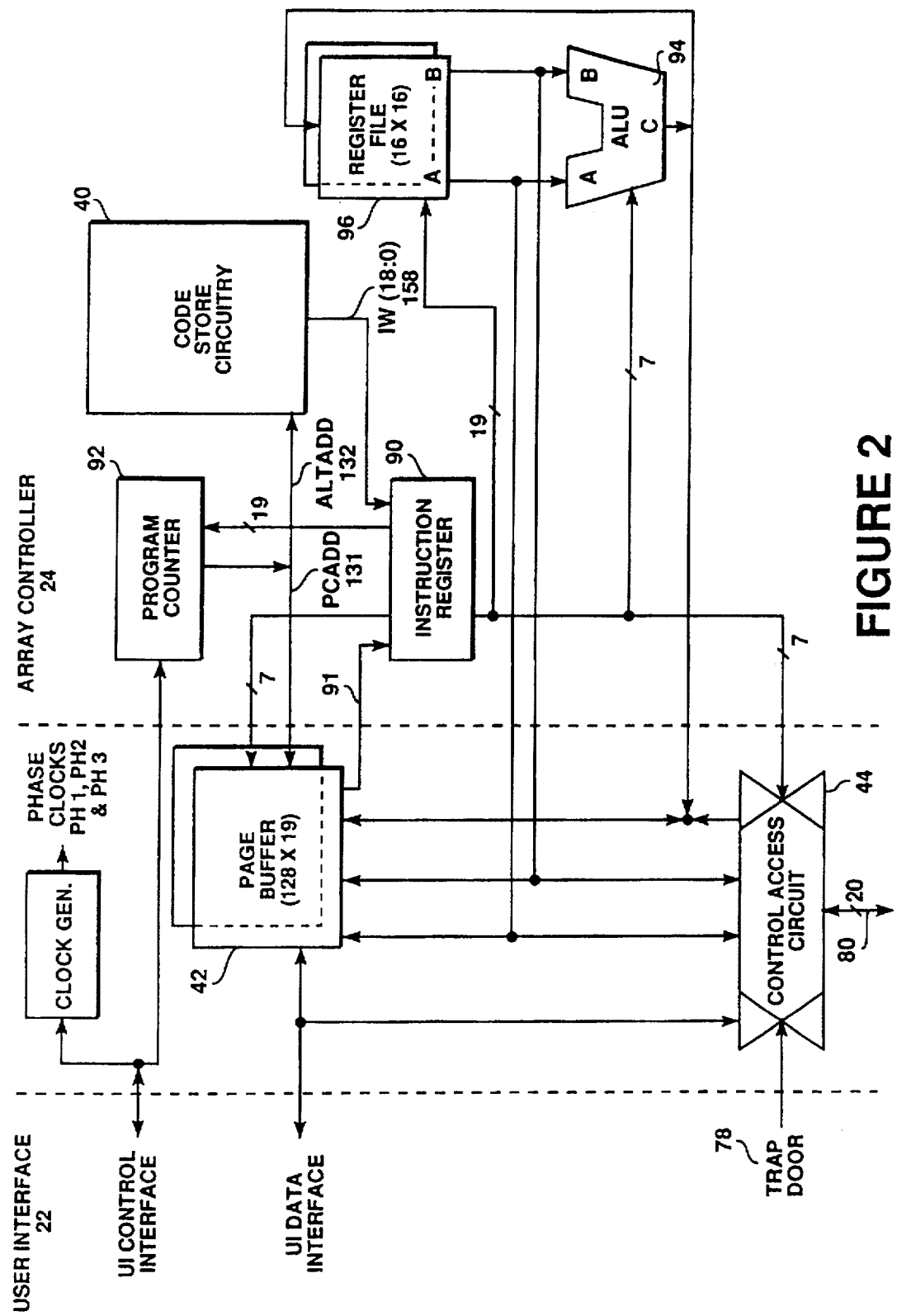
FIG. 2 is a block diagram of the array controller.

Array controller 24 is a general purpose processing structure. As shown in FIG. 2, array controller 24 includes code store circuitry 40, instruction register 90, program counter 92, arithmetic logic unit (ALU) 94, and register file 96.

Array controller 24 executes algorithms stored in code store circuitry 40. These algorithms represent instruction words, particularly data transfer instructions, computational instructions, branching instructions and control instructions. Data transfer instructions relate to moving data to and from register file 96. Branching instructions allow programming to modify the flow of an algorithm through the use of subroutine calls and conditional/unconditional jumps. Computational instructions result in operations that involve the arithmetic logic unit 94.

Algorithms stored in code store circuitry 40 are accessed via jump vectors received from user interface 22 and program addresses. Program addresses are stored in the first 32 addresses of code store circuitry 40. Code store circuitry 40 receives an address at a time from program counter 92. Code store circuitry 40 outputs instructions, an instruction at a time to instruction register 90, which latches them.

The basic function of program counter 92 is to decode the next instruction to be executed and point to the proper instruction to follow. That is to say, program counter 92 maintains the proper cycling of instructions given to array controller 24. The address provided as output of program counter 92 is used to retrieve the next instruction from code store circuitry 40 for transfer to instruction register 90 and execution by ALU 94.

ALU 94 performs all arithmetic and logic functions, and will not be discussed in detail herein. The data input to ALU 94 can be originated from multiple sources, including page buffer 42.

Register file 96 is partitioned into two sections. The first section identified as the main section, contains variables for the algorithm being executed by array controller 24. The second section contains variables for an interrupting algorithm. Therefore, when servicing an interrupt, register file 96 switches the context of array controller 24 from the main section to the second section. All operations are now performed in the interrupt section of register file 96. All variables held in the main section of register file are maintained but not accessible during interrupt servicing. After the interrupt service, control returns again to the main section.

B. The Code Store Circuitry

Figure 3:
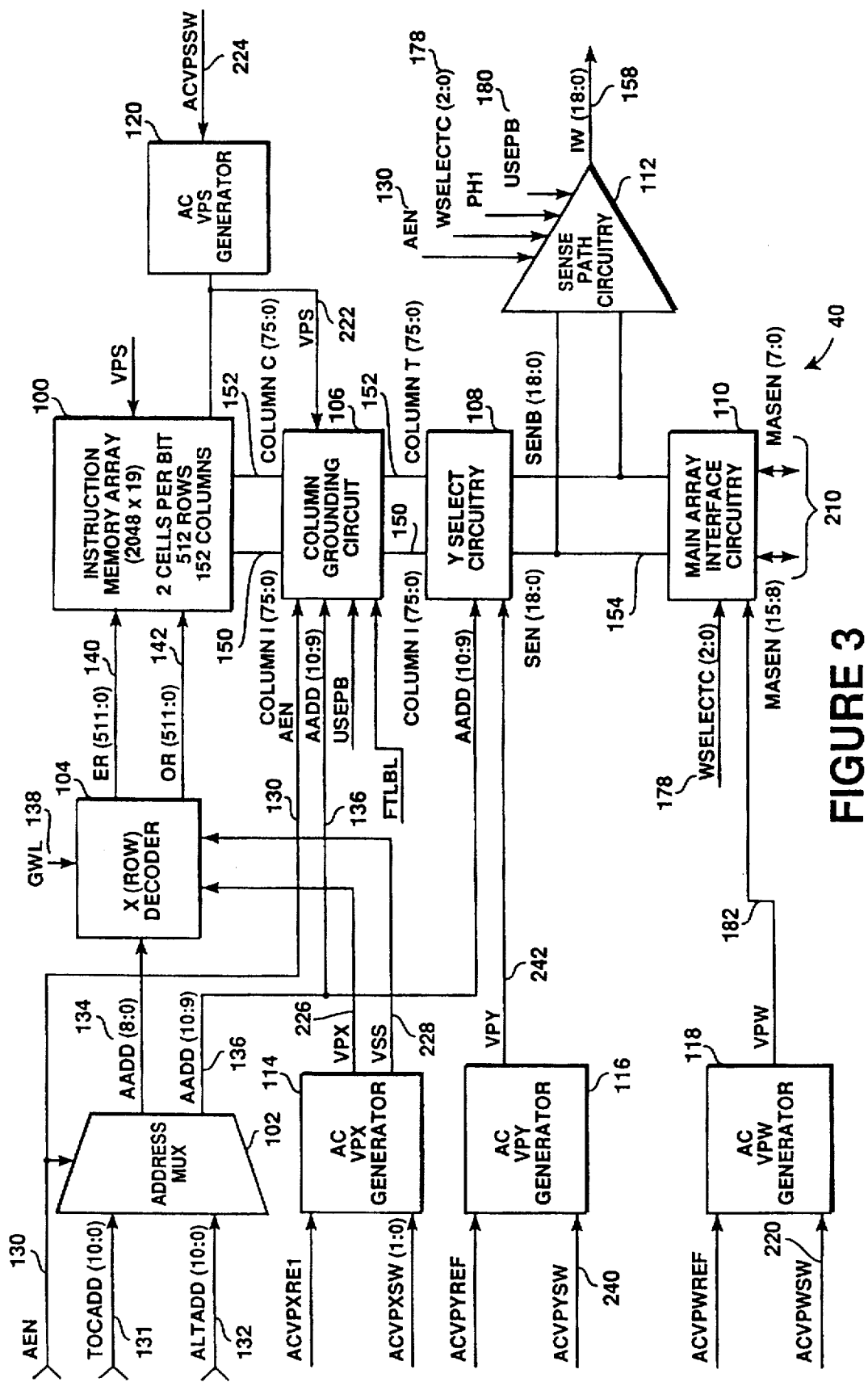
FIG. 3 is a block diagram of the code store circuitry.

FIG. 3 illustrates in block diagram form code store circuitry 40. Code store circuitry 40 stores the algorithms executed by array controller 24. Code store circuitry 40 includes control store memory array 100, address multiplexer 102, X decoder 104, column grounding circuitry 106, Y select circuitry 108, main array interface circuitry 110, sense path circuitry 112 and several voltage generators 114, 116, 118 and 120. Code store circuitry 40 permits modification of the algorithms it stores in non-read modes. As a result, an algorithm change does not require a hardware change within memory device 20.

Modification of code store circuitry 40 is possible because instruction memory array 100 is nonvolatile. Instruction memory array 100 is preferably realized with flash memory cells. Like any other flash memory array, a user modifies instruction memory array 100 via erasure, programming and verification. Thus, code store circuitry 40 operates in a number modes, which include erase and program modes. FIG. 4 lists the input signals and output signals for the modes of code store circuitry 40. Code store circuitry 40 normally operates in read mode, which permits programming, erasure and reading of main memory array 28. In other words, in read mode code store circuitry 40 generates instructions for array controller 24. Code store circuitry 40 consumes little power in read mode because of its design. Program verification and erase verification of instruction memory array 100 are performed in main access mode, which couples columns of instruction memory array 100 to read/write path 50, rather than sense path circuitry 112. Reading instruction words from instruction memory array 100 via read/write path 50 takes a number of cycles because read/write path 50 path only includes 16 sensing circuits and 16 program loads. As a result, only 8 bits and their complements from instruction memory array 100 can be read at one time.

Instruction memory array 100 preferably stores 2048 instruction words, which are each 19 bits wide. Instruction memory array 100 preferably uses two flash memory cells to store each bit of an instruction word; however, it will be obvious to those of ordinary skill in the art that control store memory array 100 can also be realized using one cell per data bit. An advantage of storing the true and complement of each bit is that each bit of the instruction word can be sensed without using reference voltages. The required 77,824 flash memory cells of this approach are preferably organized as 152 bitlines and 512 wordlines. The 52 bitlines are organized as 76 true columns and 76 complement columns. Source straps divide control store memory array 100 into groups of 4 true columns and 4 complement columns. Control store memory array 100 thus includes 19 groups of columns. Each group of columns is then coupled to a single sense amp of sense path circuitry 112. The 512 wordlines are organized as 256 even wordlines and 256 odd wordlines.

Address multiplexer 102 selects the source of address signals applied to X decoder 104. During read mode, array enable signal AEN 130 selects address signals generated by program counter 92, i.e. PCADD(10:0) 131. AEN 130 selects alternate address signals, ALTADD(10:0) 132, during program, erase and main access modes. These alternate addresses originate from address pins 70, which are coupled to address mux 102 via user interface 22. Address mux 102 couples the lower 9 bits of its output AADD(8:0) 134 to X decoder 104. The upper 2 bits, AADD(10:9) 136, are coupled to Y select circuitry 108 and column grounding circuitry 106.

X decoder 104 performs row decoding and drives wordlines within instruction memory array 100. X decoder 104 performs its task quickly, decoding each address within the first phase of a three phase clock cycle. In the erase mode, assertion of the ground wordline signal, GWL 138, causes X decoder 104 to ground all wordlines. This permits erasure of control store memory array 100. During program mode, assertion of ACVPXSW allows X decoder 104 to pull selected wordlines to Vpp; i.e., 12 volts.

X decoder 104 is organized as an X pre-decode circuit and an X driver circuit. In non-erase modes, X pre-decode circuit selects the appropriate pair of rows from the 512 rows of instruction memory array 100 in response to AADD(8:0) 134. In erase mode, all rows are selected. The X pre-decode circuit performs its task in three levels using an even row pre-decoder and an odd row pre-decoder, which are identical to each other except for the destination of their output signals. First, even row pre-decoder selects a group of 64 of the even wordlines and odd row pre-decoder selects a group of 64 of the odd wordlines. Next, even row pre-decoder selects a group of 8 from the group of 64 even wordlines. Simultaneously, odd row pre-decoder select a group of 8 from the group of 64 odd wordlines. Finally, even row pre-decoder selects 1 of the even wordlines from the group of 8 even wordlines while odd row pre-decoder selects 1 of the odd wordlines from the group of 8 odd wordlines.

The X driver circuit takes the output signals from the X pre-decode circuit and drives the selected wordlines. The X driver circuit drives the selected wordlines to VPX during programming and erasure of control store memory array 100. The X driver circuit is divided into an even row driver and an odd row driver. The even row driver is located on one side of control store memory array 100 and the odd row driver is located on the other side of control store memory array 100. The drivers within the X driver circuit are smaller than those used by main memory array 28, ¼ their size in one embodiment. The selected pair of rows is indicated via two sets of signals, odd row signals OR(511:0) 142 and even row signals ER(511:0) 140.

Figure 5:
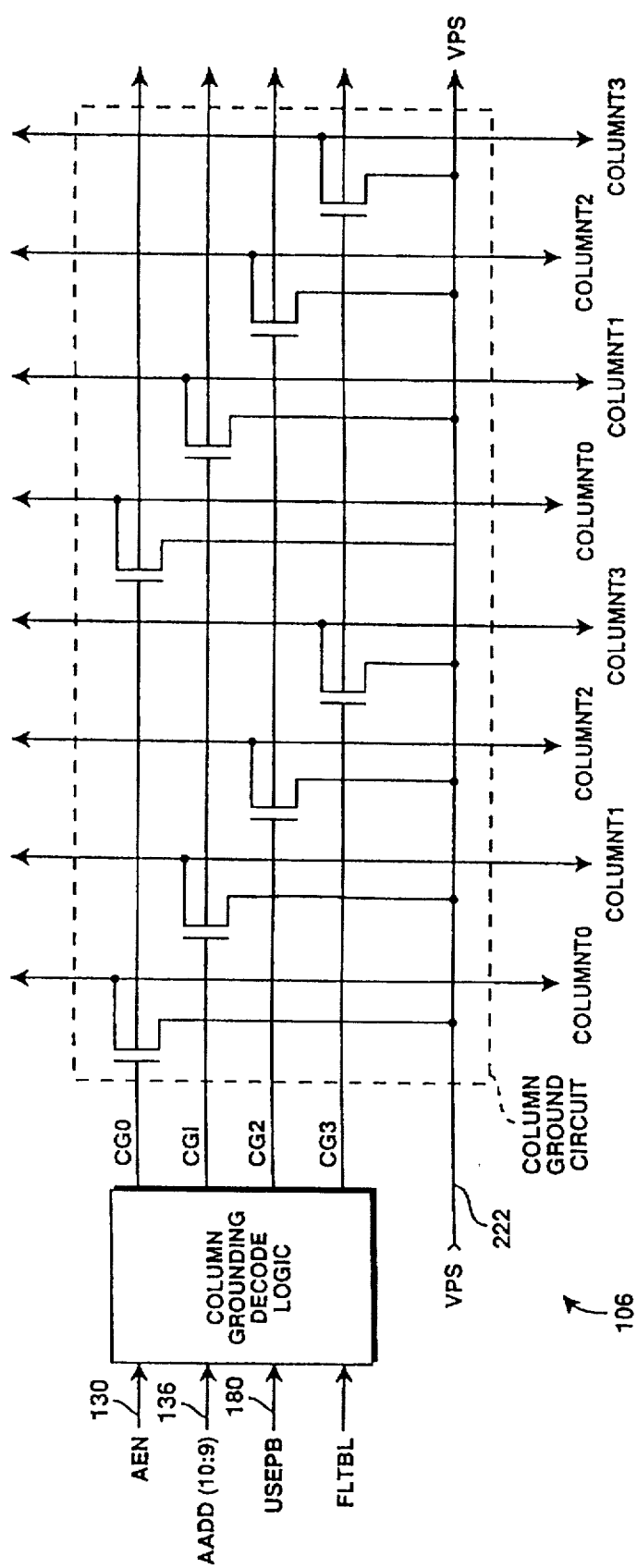
FIG. 5 illustrates the column grounding circuit.

Code store circuitry 40 implements a 4:1 to read scheme via Y select circuitry 108, column grounding circuit 106 and sense path circuitry 112. This means that four true columns and four complement columns of instruction memory array 100 are coupled to a single sense amplifier 174 of sense path circuitry 112. Thus, reading an instruction word from instruction memory array 100 requires deselecting three of every four true columns and three of every four complement columns. Column grounding circuit 106 accomplishes this task using decode logic and nineteen column ground circuits only one of which is illustrated in FIG. 5. As its name suggests, the decode logic decodes AADD(10:9) 136, AEN, USEPB and FLTBL to generate four column ground signals, CG(3:0). The response of the column decode logic to its inputs is indicated in Table II of FIG. 6. Note that the assertion of FLTBL in erase mode allows all bitlines to float and enables erasure of instruction memory 100. These four column ground signals indicate which of the three true columns and three complement columns within each group of columns should be grounded. Each of the nineteen column ground circuits uses the four column ground signals to ground three true and complement columns within its associated group of columns. This is done using a bank of pass gates. When a logic 1 is applied to a pass gate it couples the associated column to VPS; i.e., ground.

Y select circuitry 108 selects the true and complements columns to be coupled to sense path circuitry 112 by decoding AADD(10:9) 136. Stated another way, Y select circuitry 108 selects SENS(18:0) 154 and SENSB(18:0) 156 from ColumnT(75:0) 150 and ColumnC(75:0) 152 in response to AADD(10:9) 136. Y select circuitry 108 includes Y decode logic and nineteen select circuits. Each select circuit is coupled to a group of columns. Y decode logic decodes AADD(10:9) 136 to generate four select signals, only one of which is active at a time in program, read and main access modes. Each of the nineteen select circuits uses these four select signals to couple one of its associated true columns and one its associated complement columns to sense path circuitry 112 via SENS(18:0) 154 and SENSB(18:0) 156.

Figure 7A:
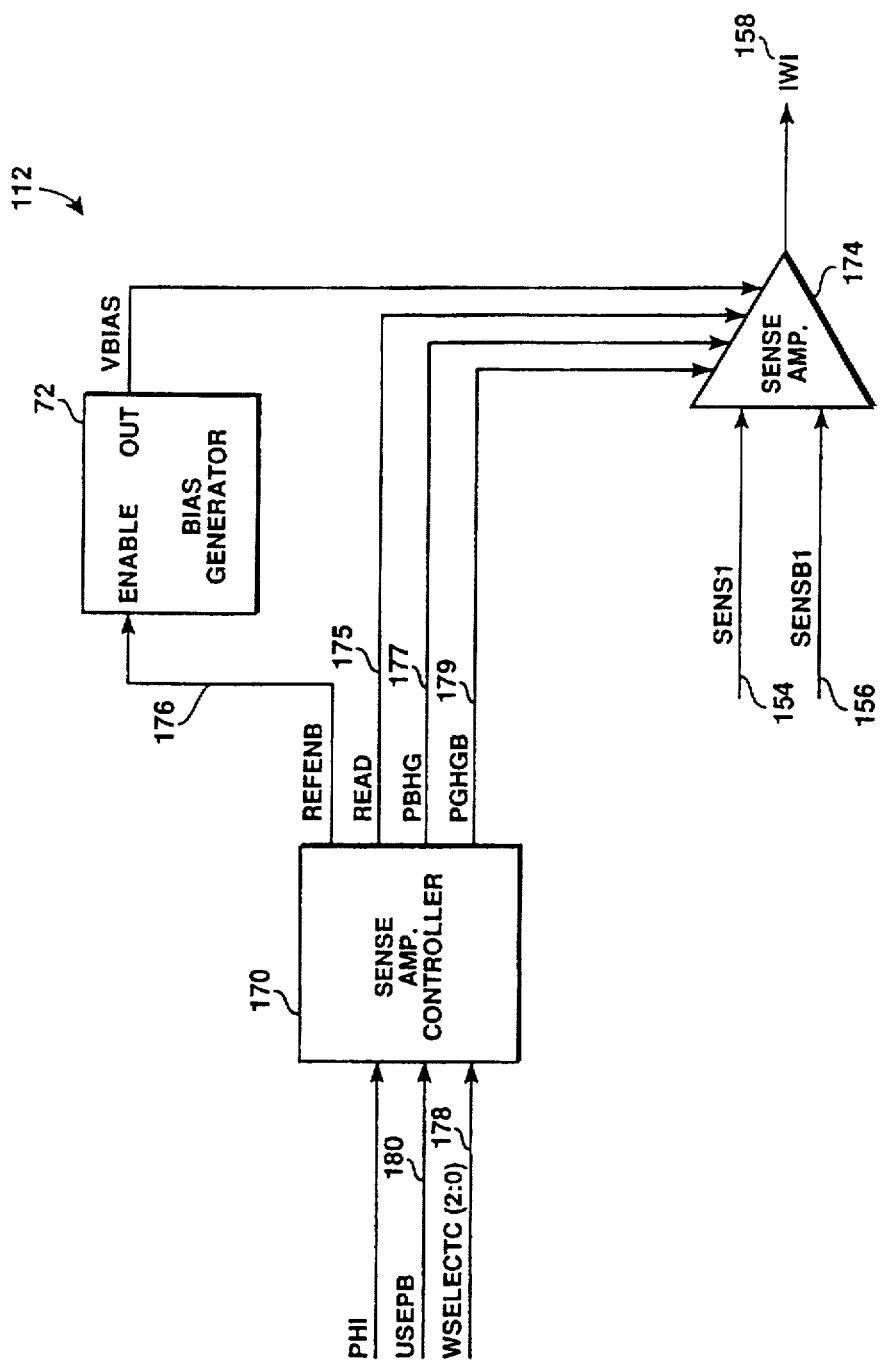
FIG. 7A is a block diagram of the sense path circuitry.

Sense path circuitry 112 operates during read mode. Sense path circuitry 112 generates the instruction word, IW(18:0) 158, from SENS(18:0) 154 and SENSB(18:0) 156 using sense amplifiers. As illustrated in FIG. 7A, sense path circuitry 112 includes sense amp controller 170, bias generator 172 and 19 sense amplifiers 174, only one of which is shown. Sense amp controller 170 controls sense amplifier 174 via precharge signals, PCHG 177 and PCHGB 179, bias enable signal, reference enable signal, REFENB 176, which is active low and read signal, READ 175. Sense amp controller 170 places sense amplifier 174 in one of two states depending upon the mode of code store circuitry 40, as indicated in Table III of FIG. 7B. In all modes other than read, sense amp controller 170 holds sense amplifiers 174 in the precharge state and disables bias generator 172 via REFENB 176. This prevents sense amplifiers 174 from driving IW(18:0) 158 and conserves power. Sense amp controller 170 identifies non-read modes via AEN 130, WSELECTC(2:0) 178 and USEPB 180. During read mode, response time of sense amplifiers 174 is improved by precharging them during address decoding, i.e. during the first phase of the three phase clock. In the remaining two phases the sense path controller deasserts the precharge signals and enables reading of sense amp inputs by bringing READ active. The instruction word IW(18:0) 158 is generated during these two clock phases.

Main array interface circuitry 110 enables programming and verification of control store memory array 100 by coupling it to the high voltage circuitry of read/write path 50 in non-read modes. Read/write path 50 is designed around main memory array 28, which stores 16 bit words. Thus, main array interface circuitry 110 selects a group of 16 of the 38 signals 154 and 156 to be coupled to read/write path 50.

Figure 8:
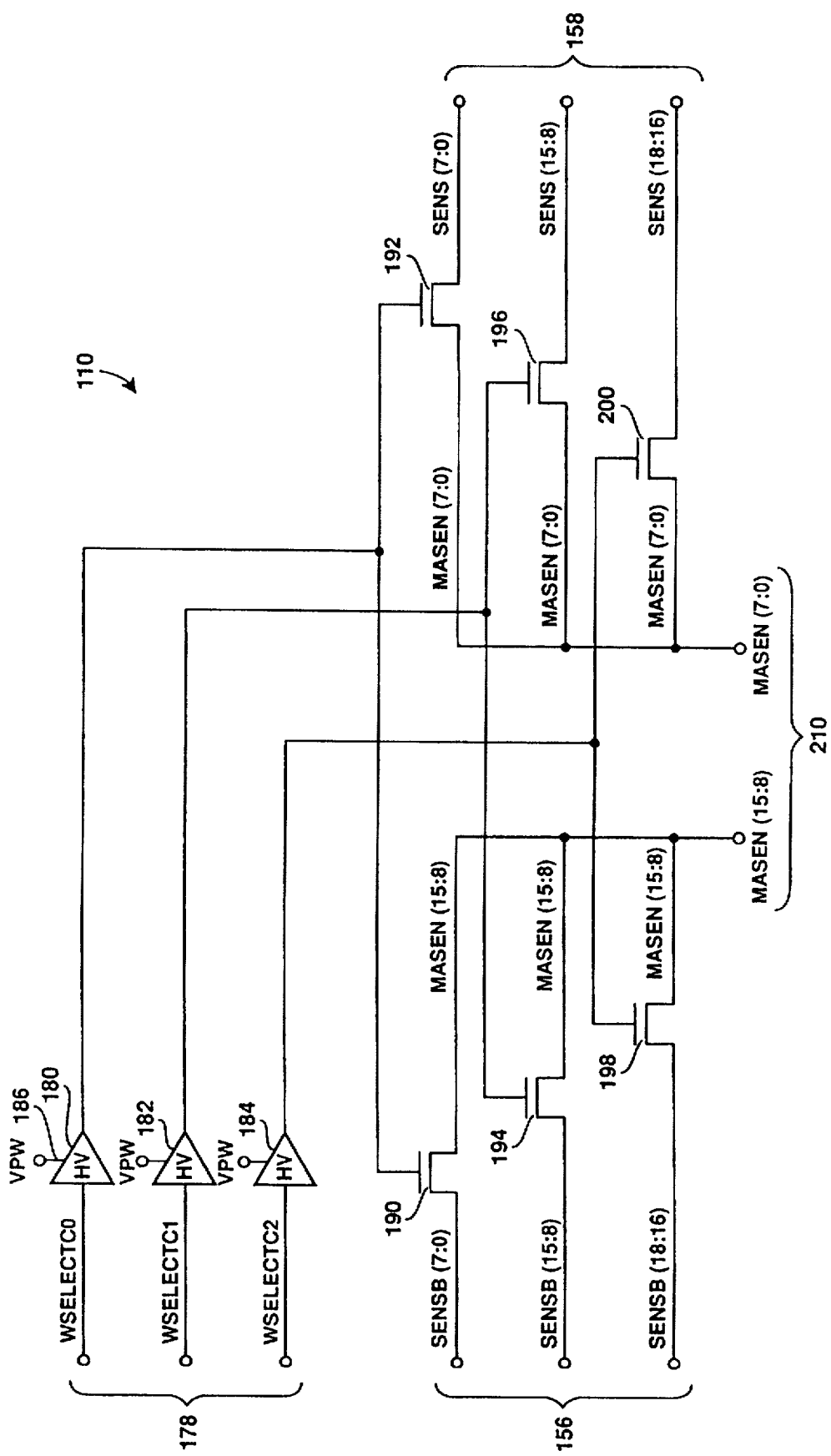
FIG. 8 is a block diagram of the main array interface circuitry.

Main array interface circuitry 110 is illustrated schematically in FIG. 8. Main array interface circuitry 110 includes six banks of pass gates 190,192, 194,196,198 and 200. Each bank of pass gates 190,192,194,196,198 and 200 is represented by a single pass gate. Each bank of pass gates 190, 192, 194,196,198 and 200 couples a subset of the signals SENS(18:0) 154 and SENSB(18:0) 156 to read/write path 50 via MASEN(15:0) 210. Select signals WSELECTC(2:0) 178 determine which pair of banks drives MASEN (15:0). Each select signal 178 is coupled to a high voltage latch 180,182 or 184, whose output controls two banks of pass gates. Thus, when WSELECTC(2:0) 178 is 001 binary, banks 190 and 192 turn on and allow SENSB(7:0) to drive MASEN(15:8) and SENS(7:0) to drive MASEN(7:0). WSELECTC(2:0) 178 equal to 010 binary turns banks 194 and 196 on, coupling SENSB(15:8) to MASEN(15:8) and SENS(7:0) to MASEN(7:0). Finally, WSELECTC(2:0) 178 equal to 100 binary turns on banks 198 and 200 and couple SENSB(18:16) to MASEN(10:8) and SENS(18:16) to MASEN(2:0).

The high voltage latches 180,182 and 184 of main array interface circuitry 110 are coupled to a power supply, whose reference is controlled by VPW 186. VPW 186 is generated by AC VPW Generator 118. Generator 118 drives VPW 186 to Vpp, 12 volts, during programming of instruction memory array 100 in response to the switch signal, ACVPWSW 220. Switch signal 220 drives VPW 186 to Vcc, 5 volts, during read operations.

AC VPS Generator 120 generates the voltage applied to the source of each memory cell within instruction memory array 100. The voltage level of VPS 222 is controlled by a switch signal, ACVPSSW 224. During the erase mode of circuitry 40, ACVPSSW 224 couples VPS 222 to Vpp, i.e. 12 volts. During program, and other modes, ACVPSSW 224 couples VPS 222 to Vcc, i.e. 5 volts.

AC VPX Generator 114 generates all the voltage levels required by X decoder 104; i.e., VPX 226 and VPSS 228.

AC VPY Generator 116 generates the voltages used by Y select circuitry 108. A switch signal, ACVPYSW 240, switches VPY 242 from 7.5 volts during program mode to approximately 5 volts during read mode.

Code store circuitry 40 operates in a read mode by default, generating instruction words for instruction register 90 and ALU 94. Operation of code store circuitry 40 in other modes requires setting control signals AEN 130, USEPB 180, WSELECTC(2:0) 178, ALTADD(10:0) 132, ACVPXSW, ACVPYSW 240, ACVPSSW 224, GWL 138, FLTBL, PBCONFIG (2:0) and WSELECTC(2:0) 178 as appropriate to the mode. These control signals can be set by the user to the desired level by addressing and writing to control registers 26. AEN 130 allows the user to control the address signals applied to instruction memory array 100, switching them from PCADD 131 to ALTADD 132. USEPB 180 allows the user to program instruction memory array 100 using an algorithm previously stored in page buffer 42. WSELECTC(2:0) 178 allows the user to couple a selected group of bits from instruction memory array 100 to read/write path 50.

Figure 9:
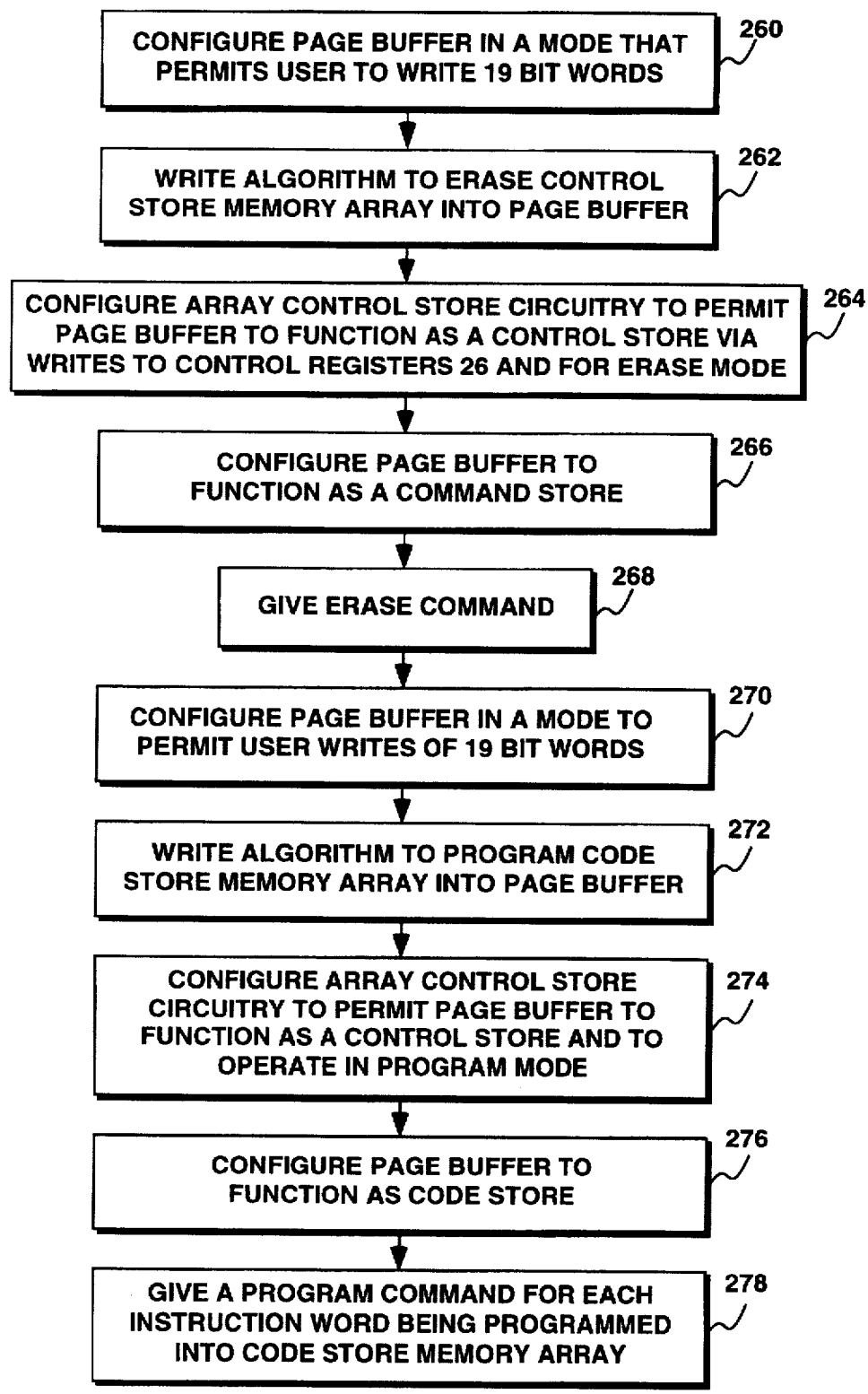
FIG. 9 is a flow diagram of a method of programming the instruction memory array of the code store circuitry.

FIG. 9 illustrates in flow diagram form a method of modifying instruction memory array 100. Programming instruction memory array 100 requires erasure prior to programming, as with all flash memory arrays. Erasure of instruction memory array 100 is accomplished using page buffer 42 as a source of instruction words for array controller 24. The instruction words stored in page buffer 42 must erase instruction memory 100. Thus, the first step, step 260, is to configure page buffer 42 so that it can store the 19 bit instruction words of an erase algorithm. This is done by setting PBCONFIG (2:0) to user mode write via access to control register 26.

In step 262, the user writes the algorithm for erasing instruction memory array 100 into page buffer 42. As is well known in the art, erasure of a flash memory cells requires grounding wordlines, allowing bitlines to float and pulling sources to 12 volts. Thus, the erase algorithm will control GWL 138, ACVPSSW 224 and FLTBL to erase array 100. The erase algorithm will not be described in greater detail because such algorithms are well known in the art.

The user must take care to write the instruction words of the erase algorithm in the correct address locations within page buffer 42. The lower 16 bits of each instruction word, IW(15:0), for the first FF (hexadecimal) instruction words must be stored in sequential order in page buffer plane A. The most significant bits of the first FF instruction words, IW(18:16), must be stored in plane C at page buffer addresses 200–27F (hexadecimal). The lower 16 bits of the instruction word for instruction words in excess of FF(hexadecimal) must be stored in sequential order in page buffer plane B. The most significant bit of these instruction words must be stored in sequential order in plane C at addresses 280–2FF (hexadecimal).

After the user has loaded the erase algorithm into page buffer 42, then in step 264 code store circuitry 40 must be configured to permit its modification. Control signals such as AEN 130 and WSELECTC(2:0) 178 must be appropriately set for erase mode, as shown in Table I.

Next, in step 266 the user configures page buffer 42 as the source of instructions for array controller 24, rather than code store circuitry 40. The user indicates this by setting USEPB 180. To allow page buffer 42 to be used so, page buffer 42 must be configured as a single 19 bit plane via page buffer configure bits, PBCONFIG(2:0), which the user also sets via one of the control registers.

Erasure of instruction memory array 100 begins in step 268 when the user issues an erase command. The algorithm stored in page buffer 42 then begins execution.

After completing step 268, the user begins preparing to program instruction memory array 100 with its modified instructions. As with erasure, this requires configuring page buffer 42 to accept 19 bit writes. That done, the user writes the program algorithm into page buffer 42. As is well known, programming flash cells requires pulling selected wordlines to approximately 12 volts, bitlines to approximately 7 volts and grounding source lines. Thus, the program algorithm will have to control ACVPSSW, ACVPYSW, ACVPWSW, ACVPXSW and GWL according to the program mode of Table I. To perform program verification, the user will also have to control WSELECTC (2:0) to transfer the sensed data to data pins 74. Program algorithms are well known and will not be described in detail herein.

The user configures code store circuitry 40 in step 274 in the same manner discussed above with respect to step 275. Then, the user reconfigures page buffer 42 to function as the source of instruction words in step 276, as done in step 266. At last, in step 278, the user begins issuing program commands, one for each instruction word to be programmed into instruction memory array 100. As with a regular program command, the command is a two cycle command. During the first cycle the program command code is given. In the next cycle, the user indicates the data to be programmed via pins 74 and 70 and the address via a subset of pins 70. The signals on these pins are transferred from the pins to array 100 and read/write path 50 as appropriate.

Once every instruction words has been programmed into instruction memory array 100, it can again function as the source of instruction words for array controller 24.

C. Page Buffer

Modification of instruction memory array 100 requires control of page buffer 42. The memory device user must be able to load all planes of page buffer 42 and to command its use as a source of instructions for array controller 24. Use and configuration of page buffer 42 is therefore described in detail now.

Page buffer 42 includes two separate 256 by 8 bit static random access memory (SRAM) planes, plane A and plane B. Plane A and plane B each include two 128×8 bit columns, col. A and col. B, and one 128×3 bit column (col. C). Column A and B store byte or word values. Column C stores the three most significant bits when page buffer 42 is being configured to be used to execute an algorithm. These bits are sometimes referred to as remanant bits.

Table IV of FIG. 10 defines the modes of page buffer 42.

In mode 0, access to page buffer 42 is disabled. Page buffer 42 is not accessible by the user interface 30 or array controller 24 in this mode.

In mode 1, page buffer 42 functions as the source of instruction words for array controller 24. Array controller 24 fetches an instruction by transferring an instruction address to page buffer 42 via ALTADD 132. Array controller 24 receives the corresponding instruction from page buffer 42 via bus 91.

In mode 2, interface circuit 22 reads page buffer 42 in user mode. Interface circuit 22 receives a read page buffer command via pins 70, 72 and 74. The read page buffer command specifies a read address for the page buffer 42. User interface 22 transfers the read address to page buffer 42 via bus 47. Page buffer 42 transfers the corresponding read data over page buffer data bus 43. User interface 22 causes multiplexer to transfer the read data via pin 74.

In mode 3, user interface 22 writes to page buffer 42 in user mode.

In mode 4, array controller 24 reads from page buffer 42 in user mode. For example, array controller 22 reads programming data from page buffer 42 during a program with page buffer operation.

In mode 5, array controller 24 writes to page buffer 40 in user mode.

In mode 6, user interface 22 read page buffer 42 as an extended 19 bit memory space.

In mode 7, user interface 22 writes to page buffer 42 as a 19 bit memory space. It is in this mode that the user writes into page buffer 42 programming the programs for and erasing control store memory array 100. User interface 22 receives a write page buffer command specifying a write address and a write data value via pins 70, 72 and 74. User interface transfers the write address to page buffer 42 over bus 47. The page buffer 42 receives the write data value via data pins 74.

Figure 11:
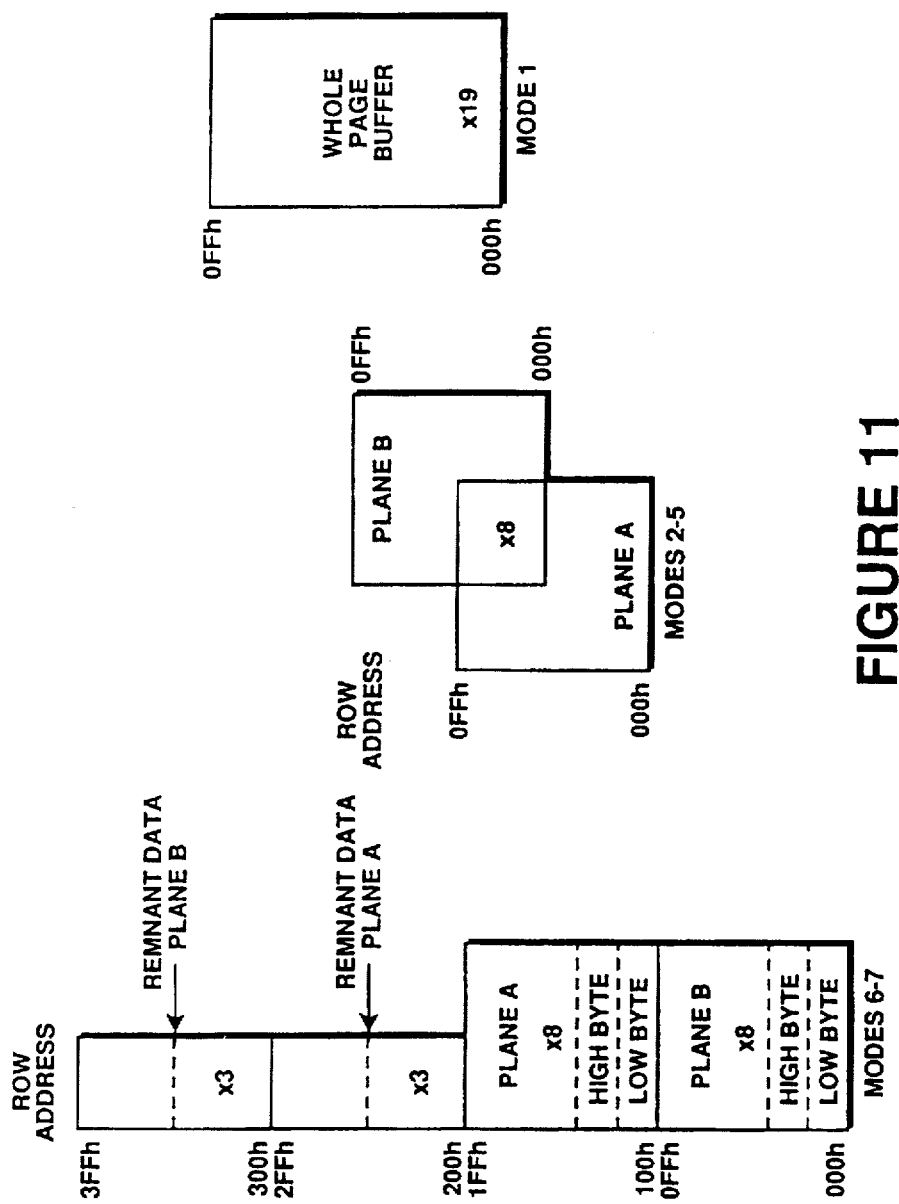
FIG. 11 illustrates the address mapping of the page buffer in its various modes.

FIG. 11 illustrates the address mapping of page buffer 42 for each mode. In mode 1, all of page buffer 42, including columns A, B and C of Plane A 310 and columns A, B and C of Plane B 320 is mapped into a 256 by 19 bit control store. In mode 1, page buffer 42 replaces code store circuitry 40 as a source of instruction words for array controller 24. Note, that in this mode page buffer 42 preferably stores 256 instruction words.

In modes 2 through 5, page buffer 42 is mapped into two independent planes (PLANE A and PLANE B). PLANE A and PLANE B are each 256 by 8 bits. In modes 2 through 5, user interface 22 coordinates access to PLANE A and PLANE B according to commands received over via pins 70, 72 and 74. User interface circuit 22 ensures that both it and array controller 24 do not access the same plane.

In modes 6 and 7, PLANE A and PLANE B are mapped into one contiguous extended memory space. The extended memory space includes columns A, B and C of plane A and columns A, B and C of plane B. Modes 6 and 7 comprise special modes for writing into page buffer 42 instruction words for later use by array controller 24.

Special mode control signals control the mode of page buffer 42. These signals include USEPB and PBCONFIG (2:0). As stated previously, the user can set these signals as desired by accessing control registers 26. USEPB determines whether page buffer 42 functions as a control store for array controller 24. PBCONFIG (2:0) determines the mode in which page buffer 42 operates.

Figure 12:
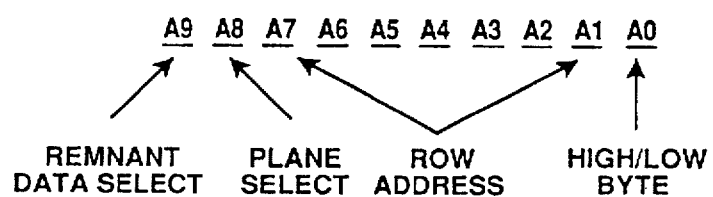
FIG. 12 illustrates the address bit fields for addressing the page buffer.

FIG. 12 illustrates the address bit fields for accessing page buffer 42.

Address bit A9 selects column C of plane A and plane B in modes 1, and 6–7. Address bit A8 functions as a plane select signal for selecting either plane A or plane B. Address bits A7 through A1 select a row within the selected plane. Each row includes 16 bits, designated as a low byte and a high byte. Address bit A0 selects either the high byte or the low byte of a row. Thus, it will be seen that writing a single 19 bit instruction word into page buffer 42 in mode 7 requires 3 operations. One write is required to load in the lower 8 bits of the instruction word. Another write is required to load in the next 8 bits, IW(15:8), and a third write to load in the remanant bits.

Page buffer 42 includes a mode detector that determines its mode.

D. Personal Computer

Figure 13:
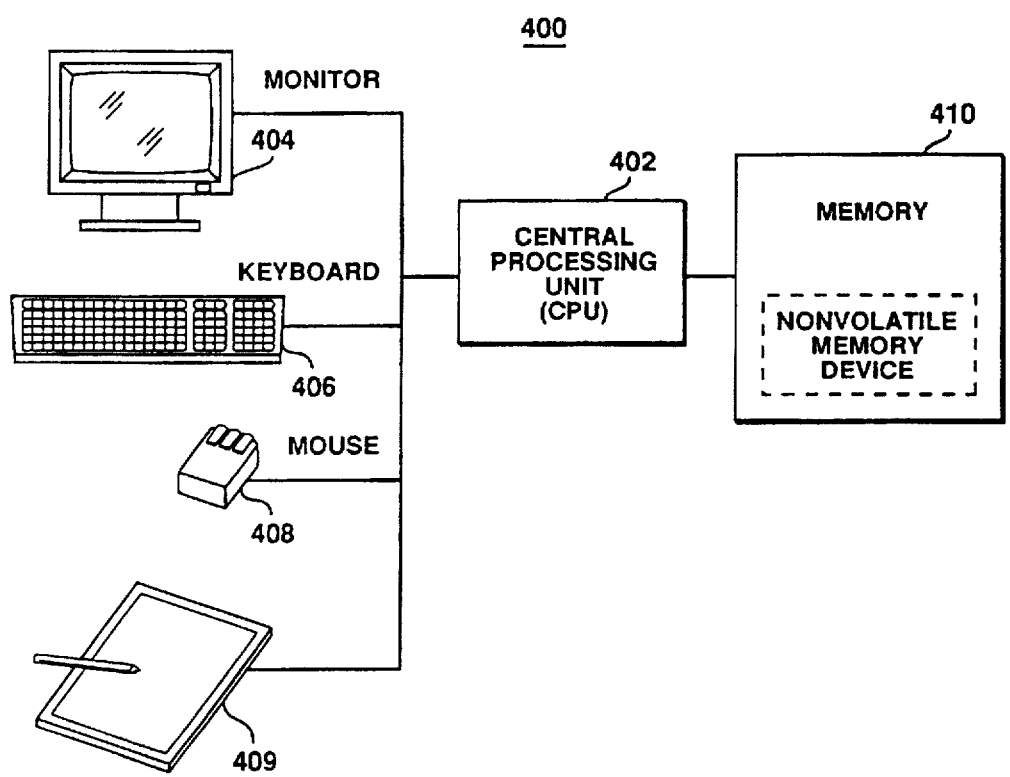
FIG. 13 illustrates a computer which includes a nonvolatile memory device that includes code store circuitry that can be modified.

FIG. 13 illustrates in block diagram form personal computer 400. Personal computer 400 includes central processing unit (CPU) 402 and monitor 404 for visually displaying information to a computer user. Keyboard 406 allows the computer user to input data to CPU 402. By moving mouse 408 the computer user is able to move a pointer displayed on monitor. The computer user may also input data to CPU 402 via pen based tablet 409. The user "writes" upon tablet 409 using a pen, wand, stylus, or other manually operated device. Tablet 409 stores the data written to it until it can download to CPU 402. Memory 410 stores data used by CPU. Memory 410 typically includes a magnetic disk drive for mass memory storage. Memory 410 also typically includes nonvolatile semiconductor memory devices 20 for storage of data that must be frequently and rapidly accessed. Memory devices 20 includes code store circuitry 40.

In the foregoing specification, the invention has been described with reference to specific exemplary embodiments thereof. It will, however, be evident that various modifications and changes may be made thereto without departing from the broader spirit and scope of the invention as set forth in the appended claims. The specification and drawings are, accordingly, to be regarded in an illustrative rather than a restrictive sense.

What is claimed is:

1. A memory array controller apparatus for accessing a main memory array, comprising:

programmable code store circuitry comprising:

a nonvolatile memory storing instructions for accessing the main memory array;

an address multiplexer for selecting addresses corresponding to instructions from one of the nonvolatile memory and an alternative source for execution in accordance with a mode of operation of the programmable code store circuitry; and main array interface circuitry selectively coupled to one of the nonvolatile memory and the main memory for performing read, erase, and program operations, wherein the main array interface is coupled to access the main memory array in accordance with instructions from the nonvolatile memory during a read mode of the programmable code store circuitry, wherein the main array interface is coupled to permit modification of the nonvolatile memory in accordance with instructions from the alternative source during a non-read mode of the programmable code store circuitry.

2. The apparatus of claim 1 wherein the main memory array comprises nonvolatile memory.

3. The apparatus of claim 2, wherein the main memory array comprises flash memory.

4. The apparatus of claim 1 wherein the nonvolatile memory of the programmable code store circuitry comprises flash memory.

5. The apparatus of claim 1 wherein the alternative source is a page buffer.

6. The apparatus of claim 1 further comprising:

a user interface for providing addresses to the address multiplexer during the non-read mode of the programmable code store circuitry; and a program counter for providing addresses to the address multiplexer during the read mode of the programmable code store circuitry.

7. A method of modifying array controller algorithms stored in a programmable code store circuitry for performing memory operations on a main memory array, comprising the steps of:

a) selecting an alternative source of instructions to provide erase instructions;

b) executing the erase instructions to erase a first set of instructions stored in the programmable code store circuitry;

c) selecting the alternative source of instructions to provide programming instructions;

d) providing at least one instruction from a second set of instructions; and e) executing the programming instructions to store the at least one instruction in the programmable code store circuitry.

8. The method of claim 7 further comprising the step of:

f) repeating step e) for every instruction of the second set of instructions.

9. The method of claim 7 further comprising the step of:

f) writing the erase instructions to the alternative source, wherein the alternative source is a page buffer.

10. The method of claim 7 further comprising the step of:

f) writing the programming instructions to the alternative source, wherein the alternative source is a page buffer.

11. The method of claim 7 wherein the programmable code store circuitry comprises nonvolatile memory.

12. The method of claim 7 wherein the main memory array comprises nonvolatile memory.

* * * * *